(12) United States Patent
Lee et al.

(10) Patent No.: US 7,122,467 B2
(45) Date of Patent: Oct. 17, 2006

(54) METHOD FOR FABRICATING SEMICONDUCTOR DEVICE

(75) Inventors: Sung-Kwon Lee, Ichon-shi (KR); Tae-Woo Jung, Ichon-shi (KR)

(73) Assignee: Hynix / Semiconductor Inc., Kyoungki-do (KR)

( * ) Notice: Subject to any disclaimer, the term of this patent is extended or adjusted under 35 U.S.C. 154(b) by 178 days.

(21) Appl. No.: 10/879,733

(22) Filed: Jun. 30, 2004

(65) Prior Publication Data

US 2005/0136642 A1    Jun. 23, 2005

(30) Foreign Application Priority Data

Dec. 22, 2003    (KR) ............... 10-2003-0094700

(51) Int. Cl.
*H01L 21/4763*    (2006.01)
(52) U.S. Cl. ............... 438/637; 438/672; 438/970
(58) Field of Classification Search ............... 438/637, 438/672, 970
See application file for complete search history.

(56) References Cited

U.S. PATENT DOCUMENTS

| | | | |
|---|---|---|---|
| 5,372,974 A | 12/1994 | Doan et al. | |
| 6,191,047 B1 | 2/2001 | Li et al. | |
| 6,569,778 B1 * | 5/2003 | Lee et al. | 438/637 |
| 6,803,318 B1 * | 10/2004 | Qiao et al. | 438/700 |
| 6,867,145 B1 * | 3/2005 | Lee et al. | 438/706 |

* cited by examiner

*Primary Examiner*—Chandra Chaudhari
(74) *Attorney, Agent, or Firm*—Finnegan, Henderson, Farabow, Garrett, & Dunner, L.L.P.

(57) ABSTRACT

Disclosed is a method for fabricating a semiconductor device with an improved process margin obtained by preventing damage to an inter-layer insulation layer during a wet cleaning process. Particularly, the method includes the steps of: forming a plurality of a first conductive pattern having a stack pattern of a first conductive and a first hard mask; forming a first inter-layer insulation layer of a good gap-fill property with a height between the first conductive material and the first hard mask on the first conductive layer; forming a second inter-layer insulation layer; forming a second conductive layer contacted the first conductive layer between the plurality of the first conductive patterns as passing through the first and the second inter-layer insulation layers; forming a third inter-layer insulation layer; forming a plurality of second conductive patterns; forming a fourth inter-layer insulation layer; and forming a third conductive layer contacted to the second conductive layer.

13 Claims, 8 Drawing Sheets

METHOD FOR FABRICATING SEMICONDUCTOR DEVICE

FIELD OF THE INVENTION

The present invention relates to a method for fabricating a semiconductor device; and particularly to a method for fabricating a semiconductor device capable of preventing a damage on a bottom conductive pattern during a contact forming process and increasing a process margin by preventing a damage on an inter-layer insulation layer induced by a wet cleaning solution during a storage node contact opening process.

DESCRIPTION OF RELATED ARTS

A lot of efforts have been made in many ways to obtain a high integration and a high capability of a semiconductor device. Among those efforts, a secure of a contact region according to the contact formation is one of the essential technologies for the high integration of the semiconductor device.

Figure 1:
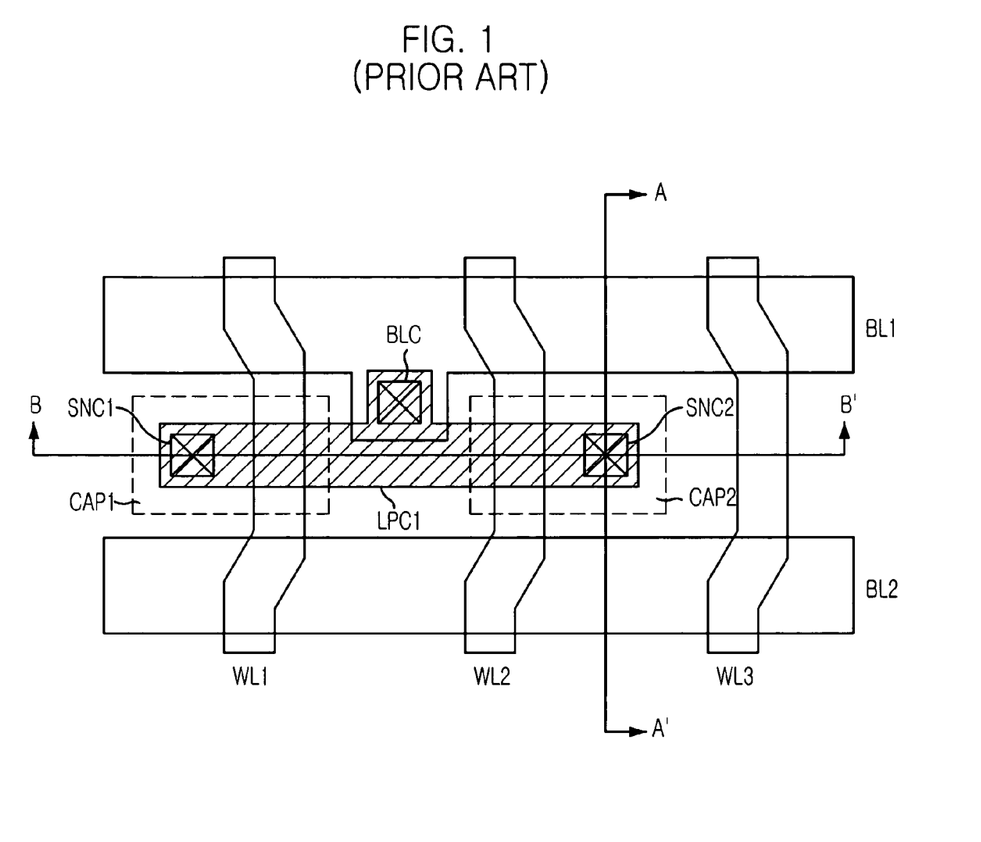
FIG. 1 is a top view illustrating a lay out of an IT cell of a semiconductor memory device.

FIG. 1 is a top view illustrating a lay out of an IT cell of a semiconductor memory device.

Referring to FIG. 1, a plurality of electrodes, i.e., a plurality of word lines WL1, WL2 and WL3 are placed in a same direction. A plurality of bit lines BL1 and BL2 are placed at the intersection of the plurality of word lines WL1, WL2 and WL3. A contact hole (not shown) is formed between the plurality of word lines W1, W2 and W3 through a mask pattern of T shape exposing a substrate, i.e., impurities diffusion region of the substrate. Through the contact hole, a landing poly plug LPC1 contacted the substrate is formed. A bit line contact BLC is formed in a middle part of the landing poly plug LPC1, thereby contacting to the bit line 1 BL1. Two edges of the landing poly plug LPC1 are electrically connected to a corresponding plurality of cell capacitors CAP1 and CAP2 through a plurality of storage node contacts SNC1 and SNC2.

FIGS. 2A to 2D are cross-sectional views taken along in the direction of a line A–A' shown in FIG. 1.

Figure 2A:
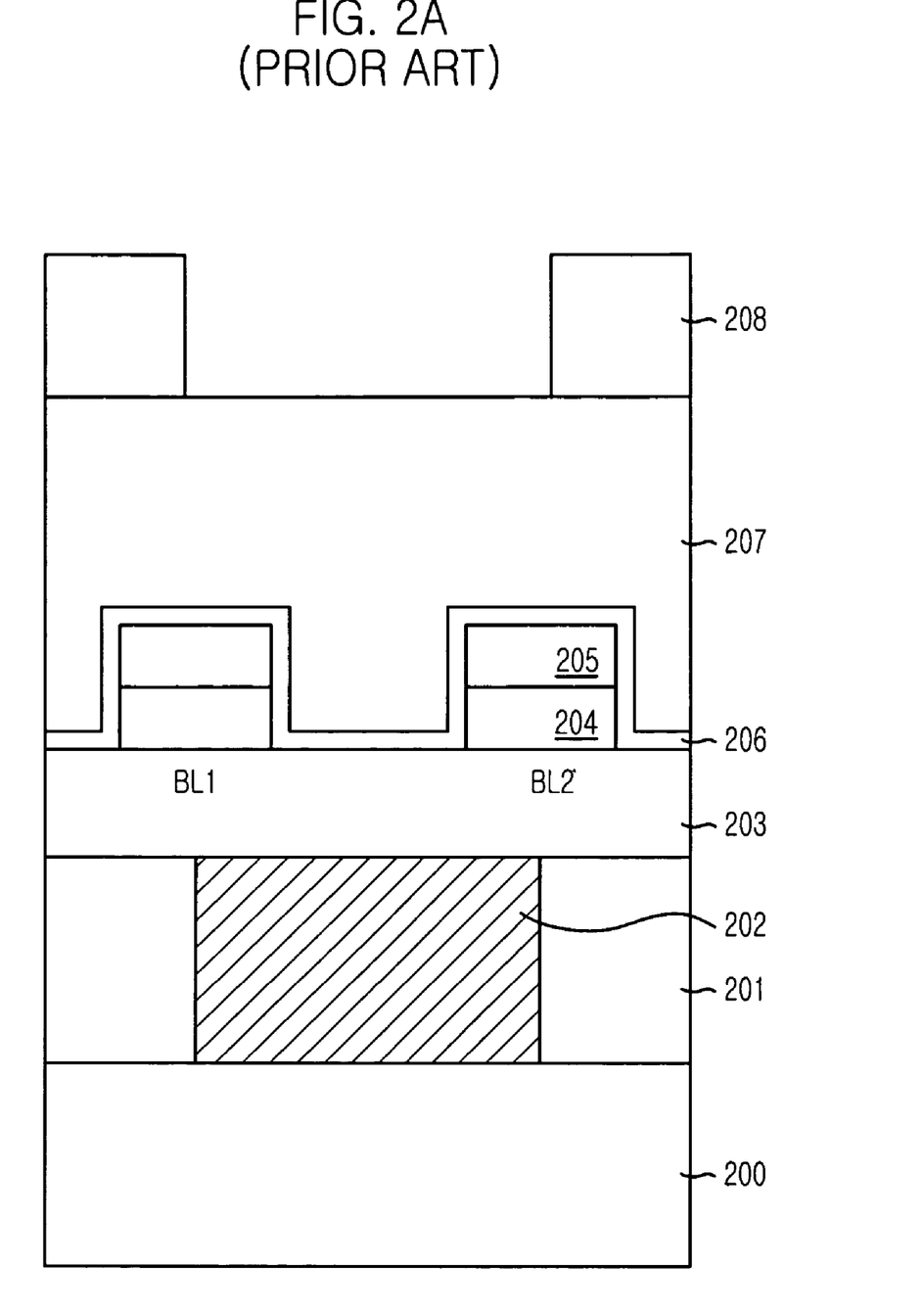
FIGS. 2A to 2D are cross-sectional views illustrating a storage node contact forming process of a semiconductor device in accordance with a preferred embodiment of the prior arts.

Referring to FIG. 2A, a transistor including a gate electrode pattern is formed on the substrate 200 provided with various device elements such as a device isolation layer and a well required to form the semiconductor device. Then, a cell contact plug 202 is formed through a cell contact process. Herein, the cell contact plug 202 is isolated by a first inter-layer insulation layer 201.

The first inter-layer insulation layer 201 is made up of an oxide-based material such as a borophosphosilicate-glass (BPSG) layer, an advanced-planarization-layer (APL), or a spin-on-glass (SOG) layer with a good gap-fill property. The cell contact plug 202 is formed in single or in combination for polysilicon or tungsten and also includes a barrier layer being made of titanium (Ti) and titanium nitride (TiN).

Then, a second inter-layer insulation layer 203 is formed on the first inter-layer insulation layer 201 and the cell contact plug 202. The second inter-layer insulation layer 203 is made up of a tetraethylorthosilicate (TEOS) layer or a high density plasma (HDP) oxide layer.

Then, a conductive layer and an insulation layer for forming a hard mask are sequentially stacked on the second inter-layer insulation layer 203. A plurality of bit lines BL1 and BL2 sequentially stacking the conductive layer 204 and the hard mask 205 is formed through a photolithography process with use of a bit line mask.

The conductive layer 204 is made up of a material selected in single or in stacking combination for poly silicon, tungsten, a tungsten nitride layer or tungsten silioxide. The hard mask 205 is made up of a nitride-based material such as a silicon nitride layer or a silicon oxide nitride layer.

To use the nitride-based material to form the hard mask 205 is because an etch profile is obtainable during a self align contact (SAC) etching process proceeded for forming the storage node contact plug and the conductive layer 204 is prevented from damaging during the etching process by using the nitride-based material having an etch selective ratio with respect to the oxide-based inter-layer insulation layer.

As a subsequent process, an etch stop layer 206 is deposited on the plurality of bit lines BL1 and BL2. At this time, the etch stop layer should be deposited thinly along a profile formed with the plurality of bit lines BL1 and BL2.

The etch stop layer 206 is made up of the nitride-based material such as the silicon nitride layer or the silicon oxide nitride layer having the etch selective ratio with respect to the oxide layer for preventing a damage on the hard mask 205 during the SAC etching process.

On the other hand, as a margin of the SAC etching process has been decreased due to an increase of an aspect ratio, the etch stop layer 206 cannot serve its role sufficiently with use of a single nitride layer. Therefore, the etch stop layer is formed by stacking a multiple number of the nitride layer.

A third inter-layer insulation layer 207, i.e., a bit line insulation layer for isolating the inter-layer insulation layers and the plurality of bit lines BL1 and BL2 is electrically deposited on the substrate 200 provided with the etch stop layer 206. The oxide-based material such as the TEOS layer or the HDP oxide layer is mainly used for forming the third inter-layer insulation layer 207.

As a subsequent process, a photoresist for use in a $F_2$ or ArF photolithography device, i.e., cyclic olefin maleic anhydride or acrylade is formed on the third inter-layer insulation layer 207 with a predetermined thickness by performing a spin coating method. Thereafter, predetermined portions of the photoresist are selectively photo-exposed by employing a photolithography device using ArF or $F_2$ light source and a predecided reticle (not shown) for defining a width of a contact plug. Then, a developing process proceeds by making a photo-exposed portion or a non-photo exposed portion remain, and a cleaning process is performed to remove etch remnants. After the photo-exposure and the developing processes, a photoresist pattern 208 for forming a storage node contact open mask is formed.

Herein, the photoresist pattern 208 can be formed with a hole type, a bar type or a T type.

During the photo-exposure process for forming the pattern, it is possible to form an anti-reflective coating (ARC) layer (not shown) between the photoresist pattern 208 and the third inter-layer insulation layer 207. The ARC layer prevents the formation of an undesired pattern caused by a light scattered at an interface between the photoresist pattern 208 and the third inter-layer insulation layer 207 and improves adhesiveness of the photoresist pattern 208. The ARC layer can be made of an organic-based material having a similar etch characteristic with the photoresist pattern 208.

A hard mask can be also formed between the third inter-layer insulation layer 207 and the photoresist and between the third inter-layer insulation layer 207 and the ARC layer. At this time, the hard mask can be made of a material such as a nitride-based insulation material or a conducting material such as tungsten and polysilicon.

Figure 2B:
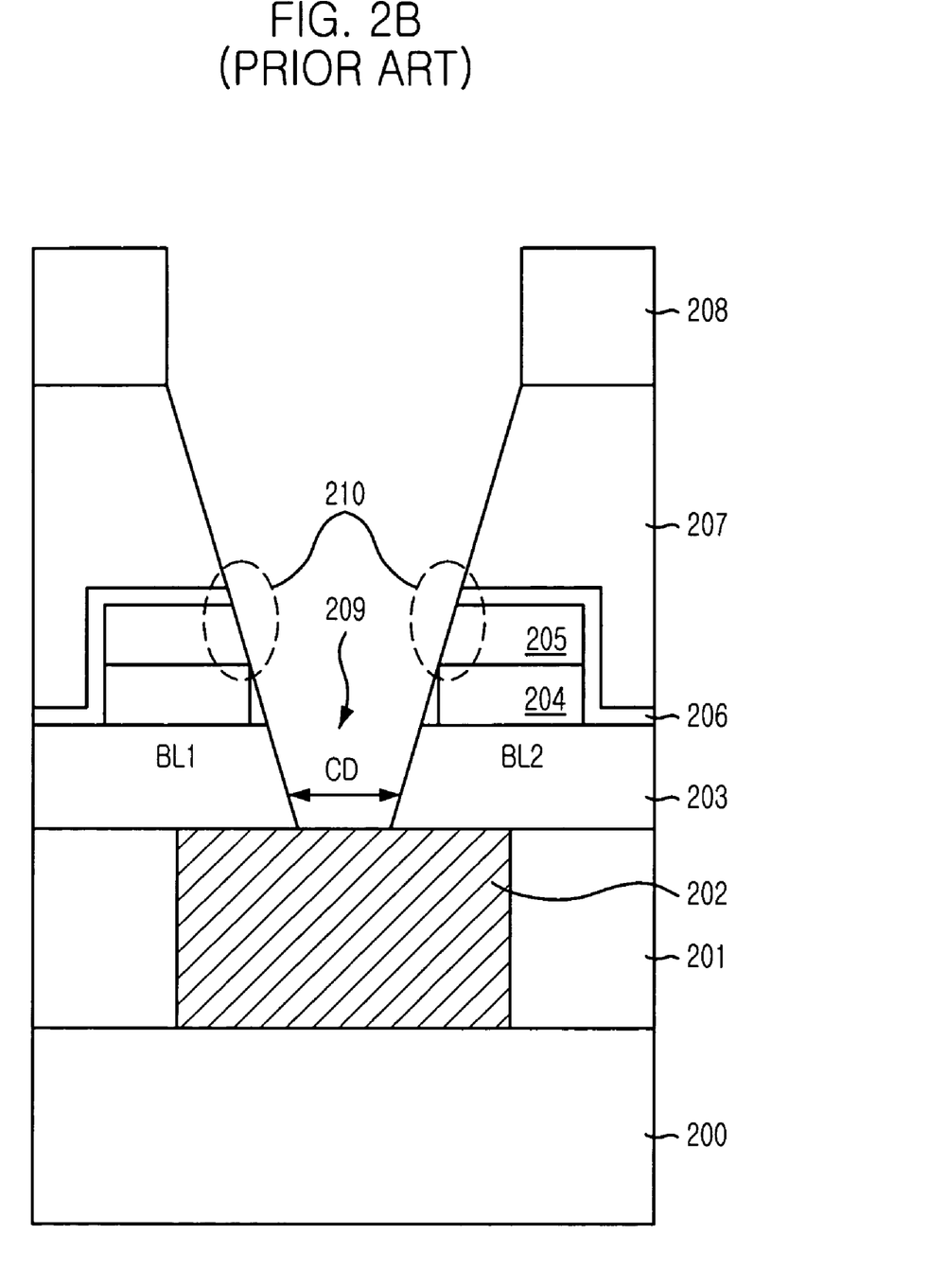

As a following process, referring to FIG. 2B, the third inter-layer insulation layer 207, the etch stop layer 206 and the second inter-layer insulation layer 203 are selectively etched back with use of the photoresist pattern 208 as an etch mask. Then the SAC etching process exposing the cell contact plug 202 is performed between the plurality of bit lines BL1 and BL2, thereby forming a contact hole.

At this time, the etching process subjected to the third inter-layer insulation layer 207 is performed with use of a typical recipe of the SAC etching process. That is, a fluorine based plasma, i.e., a gas of $C_xF_y$, in which x and y representing atomic ratios range from 1 to 10, such as $C_2F_4$, $C_2F_6$, $C_3F_8$, $C_5F_8$ or $C_5F_{10}$ is mainly used along with additional gas such as $CH_2F_2$, $C_3HF_5$ or $CHF_3$ for generating a polymer during the SAC etching process. An inactivated gas such as He, Ne, Ar or Xe for an additional carrier gas is also used.

In addition, the SAC etching process illustrated in the above, can be proceeded in several steps. However, an explanation about the detailed processes is omitted, herein.

During the etching process, a damage denoted with a numeral 201 in FIG. 2B is taken place on the plurality of hard masks 205 of the plurality of bit lines BL1 and BL2.

During the SAC etching process, the etching process is excessively performed since there are many portions to be etched back. Therefore, due to a property of the SAC etching process, the etch profile is inclined, thereby narrowing down a critical dimension (CD) of a bottom portion of the contact hole 209.

Next, when removing the photoresist pattern 208 a typical photoresist striping process is used.

Figure 2C:
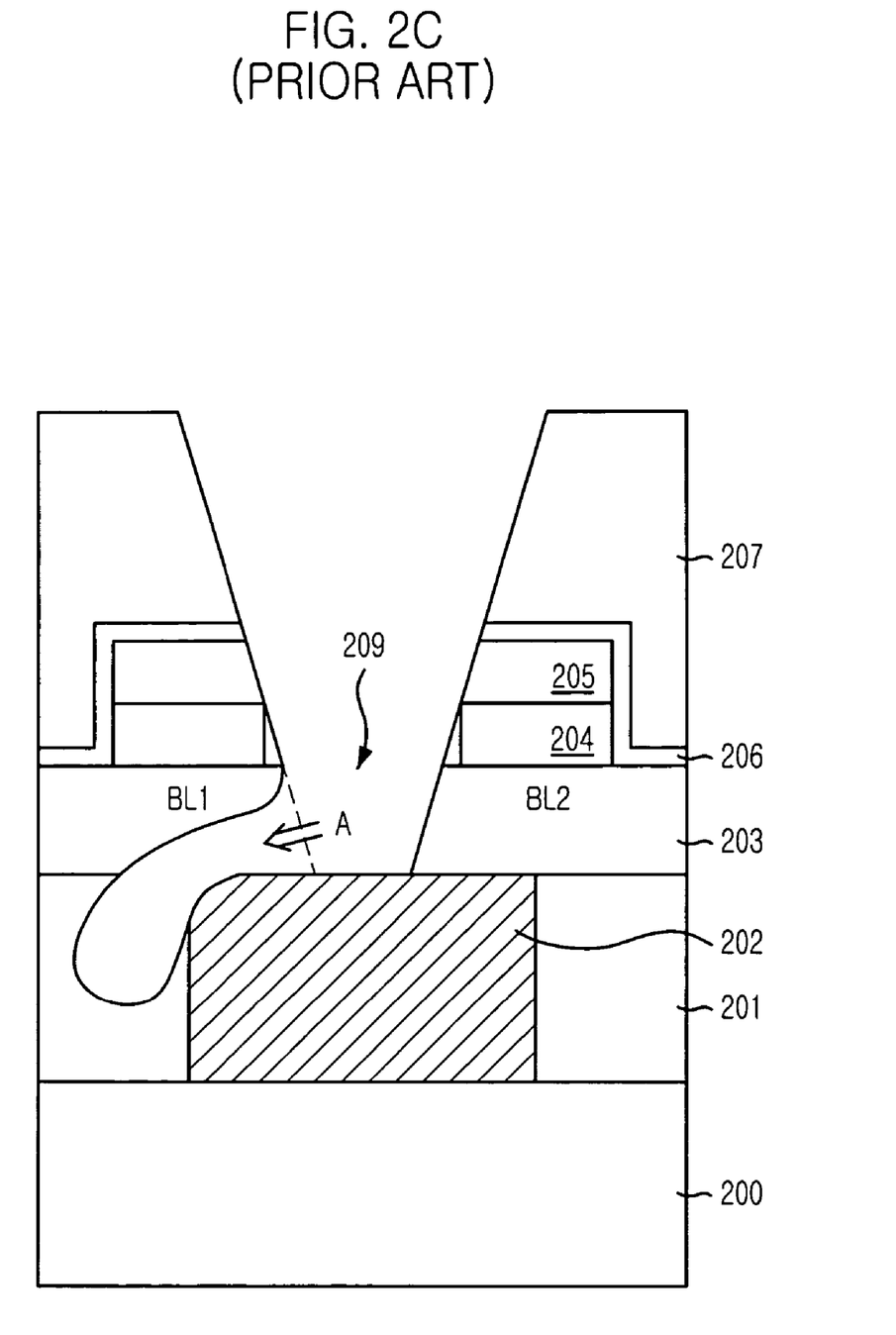

Referring to FIG. 2C, a wet cleaning process is performed with use of a cleaning solution such as buffered oxide etchant (BOE) and hydrogen fluoride (HF) in order to remove etch remnants remaining after the SAC etching process and to secure the critical dimension (CD) of a bottom portion of the contact hole 209. At this time, it is preferable to use the HF diluted with water in a ratio of 50 to 500 parts of water to 1 part of the HF is mainly used.

On the other hand, during the wet cleaning process, a damage on the first inter-layer insulation layer 201 due to the cleaning solution is represented as 'A' in FIG. 2C.

The etch remnants generated from the SAC etching process should be removed through the wet etching process. A required time for the cleaning process is increased because of a lot of the etch remnants that should be removed through the wet cleaning process. Therefore, the damage is taken place on an insulation layer being made up of the oxide-based material having a weak etching tolerance to the HF or the BOE. That is, the damage denoted with 'A' is shown on the first inter-layer insulation layer 201 being mainly made up of the BPSG layer, the APL layer, or the SOG layer.

Figure 2D:
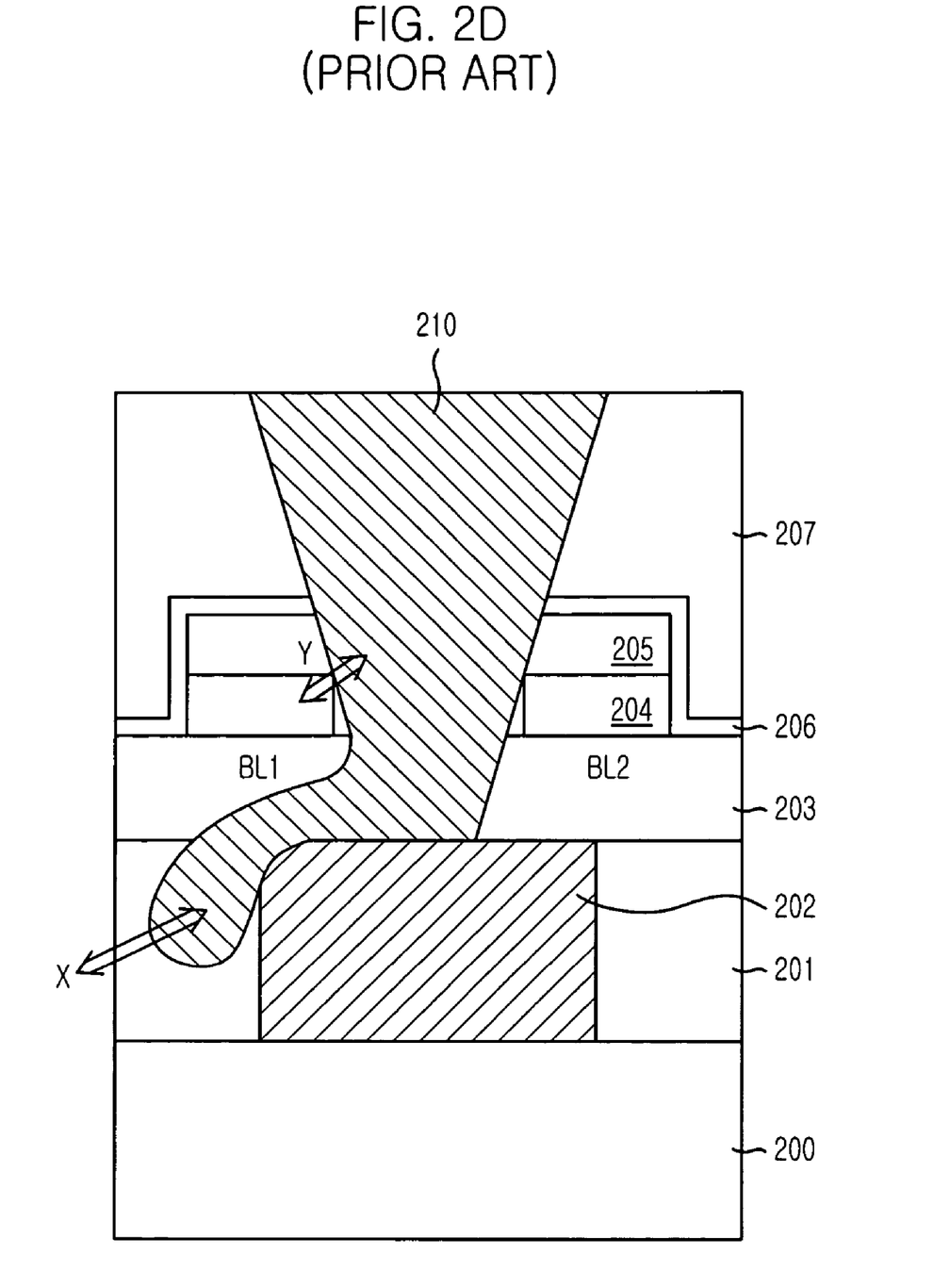

Subsequently, referring to FIG. 2D, the conductive layer for forming a plug is deposited on the substrate provided with the contact hole 209, thereby filling the contact hole 209.

Herein, the conducting material mostly used to form the conductive layer for forming the plug is polysilicon and such a barrier metal layer as titanium (Ti) and titanium nitride (TiN) can be possibly stacked thereon. It is also possible to employ tungsten (W) as the conducting material.

Subsequently, the storage node contact plug 210 is electrically connected to the cell contact plug 202 through the contact hole 209. The third inter-layer insulation layer 207 and an upper portion of the substrate are planarized by a chemical mechanical polishing (CMP) process or the etching process, through the above processes. Then, a plurality of isolated storage node contacts 210 are formed. And, it is possible that the planarizing process be proceeded until the top surface of hard mask 205 is exposed.

On the other hand, due to the damage on the first inter-layer insulation layer 201 through the wet cleaning process, there may be a problem of electric short between the isolated storage node contacts 210 as denoted with 'X' and between the conductive layer 204 and the storage node contact 210 as denoted with 'Y'. And as a property of insulation is deteriorated, an electric leakage current path is also formed. This is because, as mentioned above, the first inter-layer insulation layer 201 being made up of the BPSG layer, the APL layer or the SOG layer has a weak etch tolerance to the wet cleaning solution compared to the second inter-layer insulation layer 203 and the third inter-layer insulation layer 207.

SUMMARY OF THE INVENTION

It is, therefore, an object of the present invention to provide a method for fabricating a semiconductor device capable of preventing defect generation resulting from deterioration of a property of insulation during a cleaning process for expanding a contact opening unit.

In accordance with an aspect of the present invention, there is provided a method for fabricating a semiconductor device, including the steps of: forming a plurality of a first conductive pattern having a stack pattern of a first conductive and a first hard mask; forming a first inter-layer insulation layer of a good gap-fill property with a height between the first conductive material and the first hard mask on the first conductive layer; forming a second inter-layer insulation layer having a strong tolerance to a first cleaning solution; forming a second conductive layer contacted the first conductive layer between the plurality of the first conductive patterns as passing through the first and the second inter-layer insulation layers; forming a third inter-layer insulation layer having a strong tolerance to the cleaning solution compared to the first inter-layer insulation layer; forming a plurality of second conductive patterns; forming a fourth inter-layer insulation layer having a strong tolerance to a second cleaning solution; and forming a third conductive layer contacted to the second conductive layer as passing through the third inter-layer insulation layer and the fourth inter-layer insulation layer between the plurality of second conductive patterns.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device in accordance with a preferred embodiment of the present invention will be described in detail with reference to the accompanying drawings.

FIGS. 3A to 3E are cross-sectional views illustrating a storage node contact forming process of a semiconductor device in accordance with a preferred embodiment of the present invention. The above cross-sectional views are taken along directions of lines A–A' and B–B', respectively. Referring to FIGS. 3A to 3E, the storage node contact forming process in accordance with a preferred embodiment of the present invention is explained in detail, hereinafter.

Figure 3A:
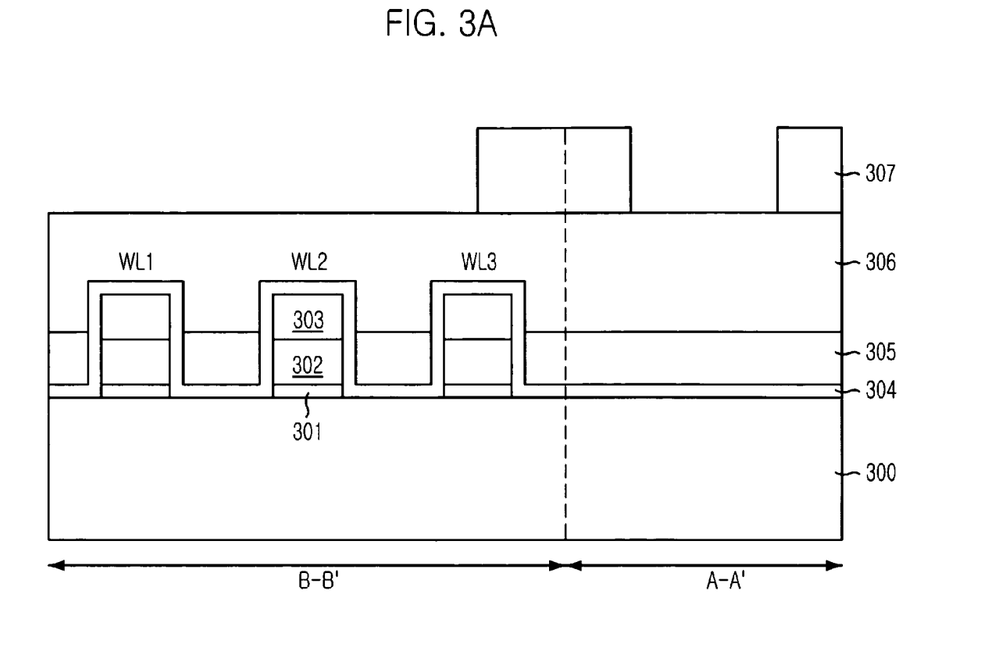
FIGS. 3A to 3E are cross-sectional views illustrating a storage node contact forming process of a semiconductor device in accordance with a preferred embodiment of the present invention.

FIG. 3A is a cross-sectional view illustrating a photoresist pattern 307 forming process as a mask for a plurality of isolated cell contacts.

First, a gate insulation layer 301, a gate conductive layer 302 and a gate hard mask 303 are sequentially deposited on a substrate 300 provided with various device elements. Thereafter, a gate electrode pattern stacking the gate insulation layer 301, the gate conductive layer 302 and the gate hard mask 303 through a photolithography process with use of a gate electrode mask is formed. Herein, the gate electrode pattern is exemplary denoted with WL1, WL2 and WL3 because a plurality of word lines are used to form the gate electrode.

An oxide-based material such as a silicon oxide layer is mainly used for forming the gate insulation layer 301. And a gate conductive layer 304 is made up of a material selected in single or in stacking combination for a group of poly silicon, tungsten, a tungsten nitride layer or tungsten silioxide. The gate hard mask 303 is made up of a nitride-based material such as a silicon nitride layer or a silicon oxide nitride layer.

To use the nitride-based material to form the hard mask 303 is because an etch profile is obtainable during a self align contact (SAC) etching process proceeded for forming the storage node contact plug and a loss of the plurality of gate patterns, i.e., WL1, WL2 and WL3 is prevented during the etching process by using the nitride-based material having an etch selective ratio with respect to the oxide-based inter-layer insulation layer.

As a subsequent process, a nitride-based etch stop layer 304 is deposited. At this time, the etch stop layer 304 is thinly deposited along a profile formed with the plurality of gate electrode patterns, i.e., WL1, WL2 and WL3.

Oxide-based first and second inter-layer insulation layers 305 and 306 for performing an insulation by isolating the plurality of gate electrode patterns, i.e., WL1, WL2 and WL3 are sequentially formed on the substrate 300 provided with the etch stop layer 304. In accordance with the present invention, an insulation layer corresponding a conventional word line insulation layer is formed with a double layer composed of the first insulation layer 305 and the second insulation layer 306.

Specifically, the second inter-layer layer 306 is made up of an insulation layer with a tolerance to a wet etch not to produce a damage caused by a first cleaning solution during a cleaning process performed after a subsequent storage node contact hole forming process of forming a subsequent storage node contact hole and the first inter-layer insulation layer 305 is made up of an insulation layer with a good gap-fill property.

Therefore, a borophosphorsilicate-glass (BPSG) layer, an advanced-planarization-layer (APL) and a spin-on-glass (SPG) layer are used for forming the first inter-layer insulation layer 305 and a high density plasma (HDP) oxide layer and a tetraethylorthosilicate (TEOS) layer are used for forming the second inter-layer insulation layer 306. In case of using the APL and the SOG layer for forming the first inter-layer insulation layer 305, the second inter-layer insulation layer 306 is made up with use of the BPSG layer. As for the TEOS layer, both a low pressure-TEOS layer and a plasma enhanced-TEOS layer can be used.

It is preferable to heighten a height of the first inter-layer insulation layer 305 than that of the gate conductive layer 302. For adjusting the height, it is possible to adjust the height of the first inter-layer insulation layer 305 when depositing or through performing a recessing process such as an etching process to the first inter-layer insulation layer 305 after depositing.

As a subsequent process, a photoresist pattern 307 as a cell contact open mask is formed on the second inter-layer insulation layer 306.

Figure 3B:
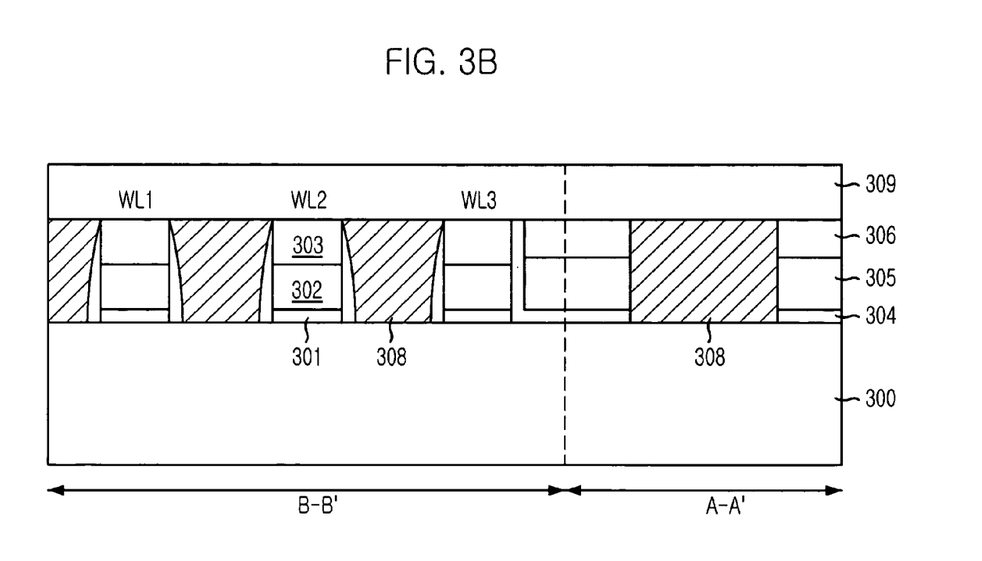

Next, referring to FIG. 3B, the second inter-layer insulation layer 306 and the first inter-layer insulation layer 305 are selectively etched back with use of the photoresist pattern 307 as an etch mask, thereby forming an opening portion, i.e., a contact hole (not shown) exposing portions (i.e., an active region such as a source/drain junction) of the substrate between the plurality of the gate electrode patterns, i.e., WL1, WL2 and WL3 at the cell region.

Next, the photoresist pattern 307 is removed through a photoresist strip process and the etch remnants are removed through the cleaning process with use of a HF based solution. From these removals, a top portion of the open portion is expanded.

A conducting material for forming the plug is filled into the open portion by using a method such as a deposition. Therefore, the plug can be electrically connected to the portions of the substrate 300 exposed during forming the open unit.

The plug material is typically made up of polysilicon or tungsten.

As a subsequent process, through a chemical mechanical process planarizing upper portions of the plurality of the gate electrode patterns, i.e., WL1, WL2 and WL3 and the second inter-layer insulation layer 306, a plurality of cell contact plug 308 isolated each other by the first inter-layer insulation layer 305 and the second inter-layer insulation layer 306 are formed.

On the other hand, the CMP process is also performed until the top surfaces of the gate electrode patterns, i.e., WL1, WL2 and WL3 are exposed.

Subsequently, a third inter-layer insulation layer 309 is formed on the cell contact plug 308 and the second inter-layer insulation layer 306.

The third inter-layer insulation layer 309 is made up of the low pressure-TEOS layer, the plasma enhanced-TEOS layer or the HDP oxide layer with a tolerance to a second cleaning solution such as HF and BOE. Herein, the first and the second cleaning solutions are the same solution.

Figure 3C:
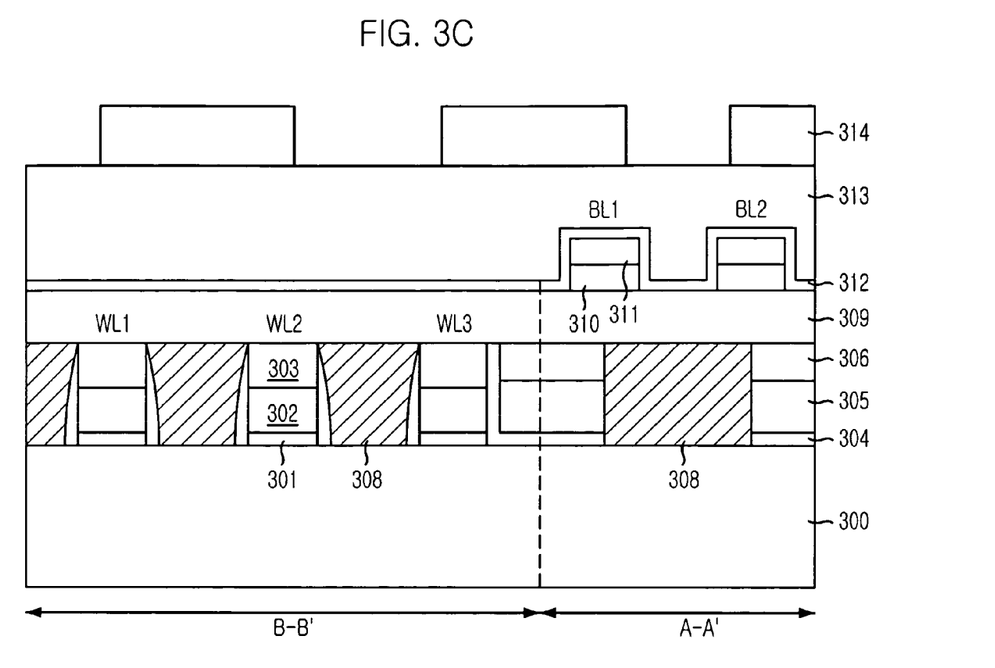

Referring to FIG. 3C, the conductive layer and the insulation layer for forming the hard mask are sequentially formed on the third inter-layer insulation layer 309. Thereafter, the plurality of bit lines BL1 and BL2 having a structure stacking the conductive layer 310 and the hard mask 311 is formed through a photolithography process with use of a bit line mask.

The conductive layer 310 is made up of a material selected in single or in stacking combination for a group of polysilicon, tungsten, a tungsten nitride layer or tungsten silioxide. The hard mask 311 is made up of the nitride-material such as a silicon nitride layer or a silicon oxide nitride layer.

By using the nitride-based material having an etch selective ratio with respect to the oxide-based inter-layer insulation layer to form the hard mask 311, an etch profile is obtainable during a self align contact (SAC) etching process proceeded for forming the storage node contact plug and the conductive layer 310 is prevented from damaging during the etching process.

Next, an etch stop layer 312 is deposited on the plurality of bit lines BL1 and BL2. At this time, the etch stop layer 312 should be deposited thinly along a profile formed with the plurality of bit lines BL1 and BL2.

The etch stop layer 312 is made up of the nitride-based material such as the silicon nitride layer or the silicon oxide nitride layer having the etch selective ratio with respect to the oxide layer for preventing a damage on the hard mask 311 during the SAC etching process.

On the other hand, as a margin of the SAC etching process has been decreased due to an increase of an aspect ratio, the etch stop layer 312 cannot serve its role sufficiently with use of a single nitride layer. Therefore, the etch stop layer is formed by stacking a multiple number of the nitride layer.

On the other hand, the etch stop layer 312 can be formed by stacking the nitride layer and the oxide layer.

A fourth inter-layer insulation layer 313, i.e., a bit line insulation layer for isolating the inter-layer insulation layers and the plurality of bit lines BL1 and BL2 electrically is deposited on the substrate provided with the etch stop layer 312. The fourth inter-layer insulation layer 313 is made up of the LP-TEOS layer, the PE-TEOS layer or the HDP oxide layer having a tolerance to a solution such as HF or BOE.

As a subsequent process, a photoresist for use in a $F_2$ or ArF photolithography device, i.e., cyclic olefin maleic anhydride or acrylaid is formed on the fourth inter-layer insulation layer 313 with a predetermined thickness by performing a spin coating method. Thereafter, predetermined portions of the photoresist are selectively photo-exposed by employing a lithography device using ArF or $F_2$ light source and a predecided reticle (not shown) for defining a width of a contact plug. Then, a developing process proceeds by making a photo-exposed portion or a non-photo exposed portion remain, and a cleaning process is performed to remove etch remnants. After the photo-exposure and the developing processes, a photoresist pattern 314 for forming a storage node contact open mask is formed.

Herein, the photoresist pattern 314 can be formed with a hole type, a bar type or T type.

During the photo-exposure process for forming a pattern, it is possible to form an anti-reflective coating (ARC) layer (not shown) between the photoresist pattern 314 and the fourth inter-layer insulation layer 313. The ARC layer prevents the formation of an undesired pattern caused by a light scattered at an interface between the photoresist pattern 314 and the fourth inter-layer insulation layer 313 and improves adhesiveness of the photoresist pattern 314. The ARC layer can be made of an organic-based material having a similar etch characteristic with the photoresist pattern 314.

A hard mask can be also formed between the fourth inter-layer insulation layer 313 and the photoresist 314 and between the fourth inter-layer insulation layer 313 and the ARC layer. At this time, the hard mask can be made of a material such as a nitride-based insulation material or a conducting material such as tungsten and polysilicon.

Figure 3D:
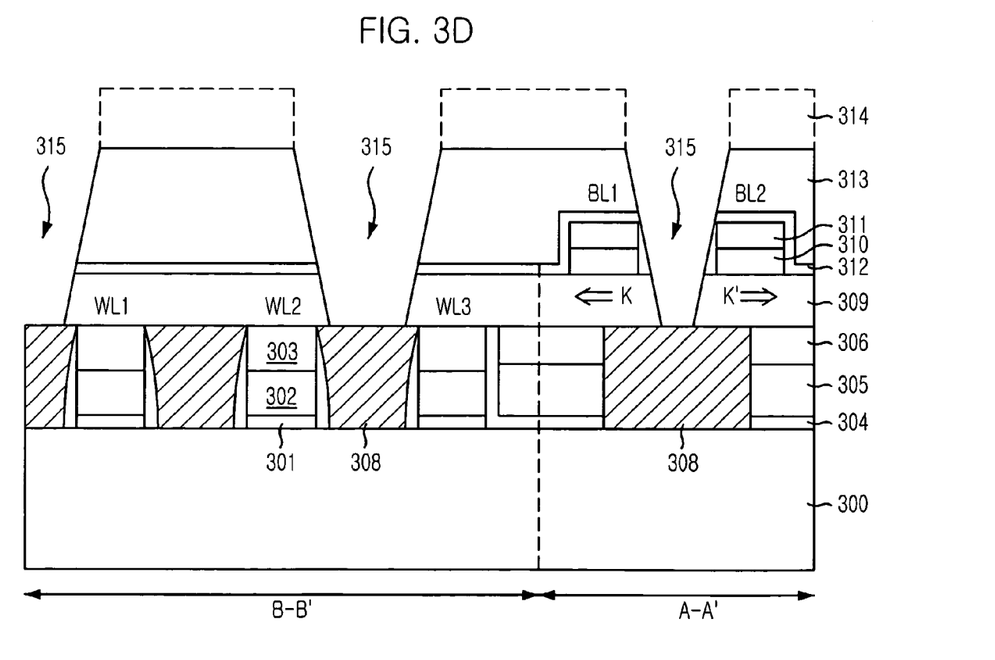

As a following process, referring to FIG. 3D, the fourth inter-layer insulation layer 313, the etch stop layer 312 and the third inter-layer insulation layer 309 are selectively etched back with use of the photoresist pattern 314 as an etch mask. Then the SAC etching process exposing the cell contact plug 308 is performed between the plurality of bit lines BL1 and BL2, thereby forming a contact hole 315.

At this time, the etching process subjected to the third inter-layer insulation layer 309 is performed with use of a typical recipe of the SAC etching process. That is, a fluorine based plasma, i.e., a gas of $C_xF_y$ in which x and y representing atomic ratios range from approximately 1 to approximately 10, such as $C_2F_4$, $C_2F_6$, $C_3F_8$, $C_5F_8$ or $C_5F_{10}$ is mainly used along with additional gas such as $CH_2F_2$, $C_3HF_5$ or $CHF_3$ for generating a polymer during the SAC etching process. An inactivated gas such as He, Ne, Ar or Xe for an additional carrier gas is also used.

In addition, the SAC etching process illustrated in the above, can be proceeded in several steps. However, an explanation about the detailed processes is omitted.

At this time, the etch stop layer 312 is removed on a sidewall of the plurality of bit lines BL1 and BL2 provided with the contact hole 315, thereby forming a spacer.

Next, when removing the photoresist pattern 314 a typical photoresist striping process is used.

As a subsequent process, a wet cleaning process is performed by using the cleaning solution such as BOE and HF in order to remove etch remnants remaining after the SAC etching process and to secure a critical dimension (CD) of each bottom portions of the contact holes 315. At this time, it is preferable to use a light HF diluted with water in a ratio of 50 to 500 parts of water to 1 part of the HF is mainly used.

At this time, during aligning the storage node contact mask, if the contact hole 315 is inclined to directions of K and K' due to misalignment, the second inter-layer insulation layer 306 is exposed through the contact hole 315.

On the other hand, the second inter-layer insulation layer 306 is made up of the TEOS layer and the HDP layer having an etch tolerance to the cleaning solution. Therefore, it is possible to prevent a damage caused by the wet cleaning solution.

Figure 3E:
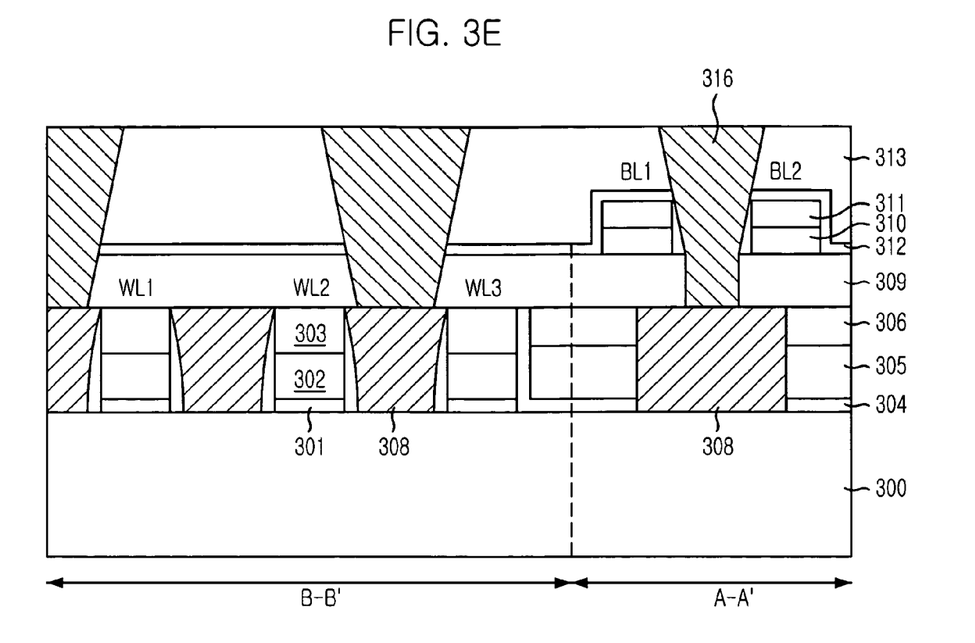

Subsequently, referring to FIG. 3E, the conductive layer for forming the plug is formed on the substrate 300 provided with the contact hole 315, thereby sufficiently filling the contact hole 315.

Herein, the conducting material mostly used to form the conductive layer for forming the plug is polysilicon and such a barrier metal layer as titanium (Ti) and titanium nitride (TiN) can be possibly stacked thereon. It is also possible to employ tungsten (W) as the conducting material.

Subsequently, by employing the CMP process a storage node contact plug 316 is electrically connected to the cell contact plug 308. Then, the fourth inter-layer insulation layer 313 and the upper portion of the substrate are planarized, thereby forming the isolated storage node contact plug 316. And the planarizing process can be proceeded exposing the hard mask 311.

Although the preferred embodiment of the present invention exemplifies the storage node contact forming process, the method for fabricating the semiconductor device can be applied with every contact forming process such as a bit line contact plug forming process and a metal contact plug forming plug.

As illustrated in the above, by stacking the multiple number of insulation layers through considering a property of each layer, this present invention makes it possible to prevent the damage on the insulation layers due to the cleaning solution during the wet cleaning process for expanding the top portion of the open portion.

Based on the preferred embodiment of the present invention, it is possible to prevent a SAC failure during a contact formation process and the damage due to the wet cleaning solution, thereby improving yields of semiconductor devices.

The present application contains subject matter related to the Korean patent application No. KR 2003-0094700, filed in the Korean Patent Office on Dec. 22, 2003 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, including the steps of:
   forming a plurality of a first conductive patterns having a stack pattern of a first conductive layer and a first hard mask on a substrate;
   forming a first inter-layer insulation layer of a good gap-fill property with a height between the first conductive layer and the first hard mask on the substrate;
   forming a second inter-layer insulation layer that tolerates a cleaning solution;
   forming a second conductive layer in contact with a surface of the substrate between the plurality of the first conductive patterns and passing through the first and the second inter-layer insulation layers;
   forming a third inter-layer insulation layer that tolerates the cleaning solution;
   forming a plurality of second conductive patterns on the third inter-layer insulation layer;
   forming a fourth inter-layer insulation layer on the second conductive patterns, wherein the fourth inter-layer insulation layer tolerates the cleaning solution; and
   forming a third conductive layer in contact with the second conductive layer as passing through the third inter-layer insulation layer and the fourth inter-layer insulation layer between the plurality of second conductive patterns.

2. The method of claim 1, wherein the first inter-layer insulation layer is made of a material selected from a group of an advanced-planarization-layer (APL), a spin-on-glass (SOG) layer and a borophosphorsilicate-glass (BPSG) layer.

3. The method of claim 2, wherein the second inter-layer insulation layer is made of one of a tetraethylorthosilicate (TEOS) layer and a high density plasma (HDP) oxide layer.

4. The method of claim 1, wherein the first inter-layer insulation layer is made of one of an advanced-planarization-layer (APL) and a spin-on-glass (SOG) layer.

5. The method of claim 4, wherein the second inter-layer insulation layer is made of borophosphorsilicate-glass (BPSG).

6. The method of claim 3, wherein the third and the fourth inter-layer insulation layers are made of a material selected from a group of a low pressure tetraethylorthosilicate (LP-TEOS) layer, a plasma enhanced tetraethylorthosilicate (PE-TEOS) layer, and a high density plasma (HDP) oxide layer.

7. The method of claim 5, wherein the third and the fourth inter-layer insulation layers are made of a material selected from a group of a low pressure tetraethylorthosilicate (LP-TEOS) layer, a plasma enhanced tetraethylorthosilicate (PE-TEOS) layer, and a high density plasma (HDP) oxide layer.

8. The method of claim 1, wherein an area of the substrate between the plurality of first conductive patterns includes an impurities diffusion region; the plurality of first conductive patterns include a plurality of gate electrode patterns; the second conductive layer includes a cell contact plug; the plurality of second conductive patterns include a plurality of bit lines; and the third conductive layer includes a storage node contact plug.

9. The method of claim 1, wherein the step of forming the plurality of first conductive patterns further includes a step of forming a first etch stop layer along a profile provided with the plurality of first conductive patterns; and the step of forming the plurality of second conductive patterns further include a step of forming a second etch stop layer along a profile provided with the plurality of second conductive patterns.

10. The method of claim 8, wherein the first and second etch stop layers are made of a structure by stacking one of a nitride layer and nitride and oxide layers.

11. The method of claim 1, wherein each of the first conductive patterns includes a first layer, the first conductive layer, and the first hard mask layer.

12. The method of claim 1, wherein the cleaning solution is a solution of hydrogen fluoride (HF) or buffered oxide etchant (BOE).

13. The method of claim 1, wherein each of the second conductive patterns includes a second layer, a second conductive layer, and a second hard mask layer.

* * * * *